United States Patent [19]

Bhattacherjee et al.

[11] Patent Number: 4,764,248
[45] Date of Patent: Aug. 16, 1988

[54] RAPID THERMAL NITRIDIZED OXIDE LOCOS PROCESS

[75] Inventors: Arya Bhattacherjee, Newark; William Koutny, Santa Clara; Ritu Shrivastava, Fremont; Thurman J. Rodgers, Woodside, all of Calif.

[73] Assignee: Cypress Semiconductor Corporation, San Jose, Calif.

[21] Appl. No.: 37,334

[22] Filed: Apr. 13, 1987

[51] Int. Cl.$^4$ .................... H01L 21/00; B44C 1/22; C03C 15/00; C03C 25/06

[52] U.S. Cl. .................................... 156/643; 156/646; 156/653; 156/657; 156/659.1; 156/662; 252/79.1; 357/49; 437/61; 437/228

[58] Field of Search ............ 156/643, 646, 653, 657, 156/659.1, 662; 427/38, 39, 399, 419.7; 252/79.1; 357/23.1, 23.11, 41, 49, 53; 437/41, 42, 56, 58, 59, 61, 62, 228, 235, 243, 244, 984

[56] References Cited

U.S. PATENT DOCUMENTS 4,455,193  6/1984  Jeuch et al. .................. 156/662 X
4,622,096 11/1986  Dil et al. ........................ 156/643

Primary Examiner—William A. Powell
Attorney, Agent, or Firm—Blakely, Sokoloff Taylor & Zafman

[57] ABSTRACT

A process for minimizing bird's beak in local oxidation of silicon which is compatible with high density (VLSI) semiconductor devices is disclosed. A pad oxide is nitridized using rapid thermal nitridization, which works quickly with minimal thermal cycling of the wafer. A silicon nitride film is then deposited over the nitridized oxide. Both films are exposed to dry plasma etching which gives more consistent results than wet methods. The field oxide is then grown and finally the masking films of the nitridized oxide and silicon nitride are removed, whereby field oxides are grown with minimal bird's beak, and minimal damage to the wafer with a small number of steps. The pad oxide may be grown in the same rapid thermal annealer used for the rapid thermal nitridization. Both cycles (pad oxide growth and nitridization of the pad oxide) can be integrated to "one" cycle and performed sequentially in the same rapid thermal annealer to increase throughput and improve device quality.

8 Claims, 7 Drawing Sheets

FIGURE 1f   BIRDS' BEAK

RAPID THERMAL NITRIDIZED OXIDE LOCOS PROCESS

FIELD OF THE INVENTION

This invention relates to local oxidation of silicon in the production of semiconductor devices. In particular it concerns a process for the formation of local oxidation regions in silicon substrates.

BACKGROUND OF THE INVENTION

Semiconductor chips made in MOS (metal-oxide-semiconductor) technology often contain many devices in close proximity which produce or are affected by electrical or magnetic fields. This close proximity can result in unwanted interactions between the devices. To prevent these interactions, field oxides are grown "locally" between devices to isolate them from each other. However, these oxide isolation zones consume valuable space on the semiconductor which might otherwise be used for other devices. This is particularly true when these isolation zones include "bird's beak" formations. As explained below, bird's beaks are unwanted areas of field oxide at the edges of the isolation zones. As miniaturization increases, it becomes increasingly important to eliminate all field oxide which is not essential for isolating devices.

Field oxide growth is typically controlled by coating the silicon wafer upon which the oxide is to be grown with a silicon nitride film. The nitride film is then etched away where field oxide is desired. When the wafer is exposed to an oxygen source under oxidizing conditions, field oxide grows in the etched areas but not in the areas covered with the silicon nitride film. This results in local isolation regions.

The bird's beak problem occurs because silicon is normally covered with an oxide below the nitride. This "pad" oxide is typically in the range of 300–1000 Angstroms. As the field oxide grows, it grows into the pad oxide film beneath the silicon nitride film, due to the diffusion of oxidizing species into the sandwich formed by the pad oxide and the silicon nitride, forming a pointed structure which partially penetrates the area designated for devices in the upper surface of the substrate. This pointed structure is the bird's beak. It reduces available space on the wafer.

The early prior art for growing field oxides is reported in, for example, "Local Oxidation of Silicon and its Application in Semiconductor-Device Technology," J. A. Appels, E. Kooi, et. al., Vol. 25 of Philips Res. Repts, Pages 118-132 (1970). That article teaches the use of silicon nitride mentioned above. The standard local oxidation process begins with a silicon substrate 1 covered with a pad oxide 2, as shown in FIG. 1a. A film of silicon nitride 3 is then deposited over the pad oxide, as shown in FIG. 1b. This is commonly done in a reactor containing Silicon Hydride and $NH_3$ (ammonia) supplied in a hydrogen carrier into the reactor which is maintained at 900° C. to 1000° C., a process known as chemical vapor deposition (CVD). After that, a $SiO_2$ film 4 is formed over the silicon nitride 3, as shown in FIG. 1c. A photoresist layer may be employed instead of the masking $SiO_2$ film 4 as is well known in the art. After photolithography, the $SiO_2$ film 4 is etched in a buffered HF bath, producing the structure shown in FIG. 1d, and the silicon nitride 3 is etched in an $H_3PO_4$ bath, producing the structure shown in FIG. 1e. As is well known in the art, $H_3PO_4$ cannot be used if the photoresist layer is used in place of $SiO_2$ film 4; conventional plasma etching with flourine chemistry is used to etch the photoresist layer.

The result (FIG. 1e) is a silicon substrate 1 masked by films of pad oxide 2, silicon nitride 3 and the $SiO_2$ film 4. In those areas where field oxide is desired, the bare silicon (or the silicon substrate covered by native oxide) is exposed to an oxygen source. The masked wafer is placed in an oxidizing ambient, typically saturated with $H_2O$ at 1000° C. for 6 to 15 hours to grow the field oxide 5, producing the structure shown in FIG. 1f. Finally, acid baths are again used to remove the remaining films of silicon dioxide 4, silicon nitride 3 and pad oxide 2, producing the structure shown in FIG. 1g. Prior to the formation of the field oxide 5, the $SiO_2$ layer 4 is often removed after forming masks of silicon nitride 3. Direct deposition of nitride on native oxide give rise to stress induced leakage. In the existing art, the native oxide, which is less than 40 Angstroms, is replaced by a grown "pad" oxide to relieve the above stress. This "pad" oxide is in the 300–1000 Angstrom range.

It was with the use of these early processes that bird's beak problems developed as explained above (see, e.g., FIG. 1f). The Appels, et al. article does not teach any method for limiting bird's beak growth. Various methods in the prior art attempt to limit the growth of bird's beak.

One prior art method for reducing bird's beak (reported in "Sealed Interface Local Oxidation Technology," J. Hui, et. al., IEEE Transactions on Electron Devices, Vol. ED-29, No. 4, pages 554–561 (1982) ) teaches the addition of nitrogen into the native oxide (before the silicon nitride masking film is formed) by either nitrogen ion implantation (low energy) or plasma-enhanced thermal (high temperature) nitridation. A silicon nitride layer is then formed on top of the nitridized native oxide and the process continues in the normal manner. Another prior art technique is reported in "A Bird's Beak Free Local Oxidation Technology Feasible for VLSI Circuits Fabrication," K. Y. Chiu, et. al., IEEE Transactions on Electron Devices, Vol. ED-29, No. 4, Pages 536–540 (April 1982). That technique starts with a silicon substrate 1 and a stress relief oxide 6 shown in FIG. 2a, which is masked with silicon nitride 3 and then etched (in several masking and etching steps, the $Si_3N_4$, $SiO_2$ and Si substrate are etched) in the areas where field oxide is desired, resulting in grooves in the silicon base, as shown in FIG. 2b. A second stress relief oxide 7 is formed on the grooves and sidewalls of the newly etched surface, as shown in FIG. 2c. A second film of silicon nitride 8 is then deposited on the entire surface as shown in FIG. 2d.

The structure shown in FIG. 2d includes the elevated island region, where devices (e.g. a MOSFET—an MOS Field Effect Device) will be applied and the planar surface of the grooves where the field oxide will be formed. In FIG. 2d, the island is covered by both nitride 3 and nitride 8 while the planar surface of the grooves is covered by nitride 8. A strongly unidirectional plasma nitride etch is applied to the structure of FIG. 2d; to remove the nitride 8 on the surface of the grooves such that the sidewalls of the island remain covered by nitride 8 and the top surface of the island is covered by the nitride 3, resulting in the structure shown in FIG. 2e (Note: the stress relief oxide 7 may actually remain on the planar surface, but it is not shown in FIG. 2e).

When the field oxide 5 is grown, birds' beaks are prevented by the sidewall masking effect of the nitride 8; see FIG. 2f. The silicon is then cleaned of remaining films above the device region and the field oxide 5 is etched before semiconductor devices are applied, as shown in FIG. 2g.

Another prior art technique for reducing bird's beak uses a nitrided oxide as a local oxidation mask and the final gate dielectric. See "A Metal-Gate Self-Aligned MOSFET Using Nitride Oxide", M. A. Schmidt, e. al., IEEE Transactions on Electron Devices, Vol. ED-32, No. 3., pages 643-648 (Mar. 1985). The technique produces a nitrided oxide, used as a field oxide mask, as the source/drain implant mask and as the gate dielectric, by a long exposure (2 hours) at 1000° C. in a pure ammonia ambient. After forming the nitrided oxide, a photoresist layer is deposited and patterned by etching to produce a photoresist mask over the channel region. The photoresist (and nitrided oxide) mask a source-drain implant. The nitrided oxide is etched after the implant and the photoresist is removed, leaving the nitride oxide only in the channel region. Field oxide is now grown.

Some of these prior art techniques are illustrated in FIGS. 1a through 2g, which represent the prior art. As will be understood by those in the art, the FIGS. 1a through 3f illustrate one device region which is usually surrounded by many such similar device regions.

The prior art techniques for reducing bird's beak increase the number of steps for and the complexity of field oxide growth over the standard local oxidation process. Further, these processes, using high temperature nitridization steps, are incompatible with large wafer (e.g. 5 inch diameter wafers), high density CMOS production. For example, because of the long exposure to high temperatures, long thermal nitridizations can warp large wafers. It can also propagate subsurface defects (in, for example, defect free denuded zones) and deteriorate subsurface implants. In CMOS, the PMOS device design often incorporates a N-type retrograde implant early in the process. This retrograde profile needs to be very shallow to prevent punch through. A long, high temperature step will drive (through diffusion) the implant deep. Wet acid etching has drawbacks as well. For nitridized films the effectiveness of such etching varies with film thickness and film nitridization. As a result, large erratic encroachments of bird's beak develop where there are thin spots in the film.

The present invention overcomes these shortcomings in the prior art without increasing the complexity of the process or the number of steps necessary to manufacture semiconductor integrated circuit chips. In the sections below a new process is described for local oxidation of silicon which minimizes bird's beak.

SUMMARY OF THE INVENTION

Local oxidation of silicon (LOCOS) with minimal bird's beak and suitable for very large scale integration (VLSI) semiconductor chips is achieved without substantial time cycles which tend to drive dopants (through thermal diffusion) into areas where they are not intended to be present. Rapid thermal nitridization is used to form a nitridized pad oxide which is formed on the silicon substrate. The pad oxide is preferably grown in the same rapid thermal annealer used for the rapid thermal nitridization. A silicon nitride film is then formed over the pad using low pressure CVD. After photolithography, the films are etched in dry plasma. The field oxide is grown, and finally the masking films of silicon nitride and the nitridized pad oxide are removed. LOCOS is thereby simplied while bird's beak and thermal cycling are reduced.

BRIEF DESCRIPTION OF THE DRAWINGS

FIG. 1f is a cross-sectional diagram of the substrate of FIG. 1e after a field oxide has been grown showing the field oxide's lateral encroachment under the silicon nitride mask, known as bird's beak.

FIG. 3cc is a cross-sectional diagram of the substrate of FIG. 3c after a photoresist layer has been applied and patterned on the silicon nitride layer 24.

DESCRIPTION OF THE INVENTION

The process of the present invention begins with a silicon wafer which includes a silicon substrate suitable for large scale integrated semiconductor devices. For example, for very large scale integrated CMOS devices, a 5 or 6 inch diameter wafer of p-type conductitivity, which is comprised of a monocrystalline silicon substrate doped with a p-type material (e.g. boron), is often used. In the following description, numerous specific details are set forth such as temperatures, times, thicknesses, etc. in order to provide a thorough understanding of the present invention. However, it will be obvious to one skilled in the art that the present invention may be practiced without these specific details. In other instances well-known steps have not been described in detail, such as the "front end" cleaning steps, in order not to unnecessarily obscure the present invention.

Figure 1A:
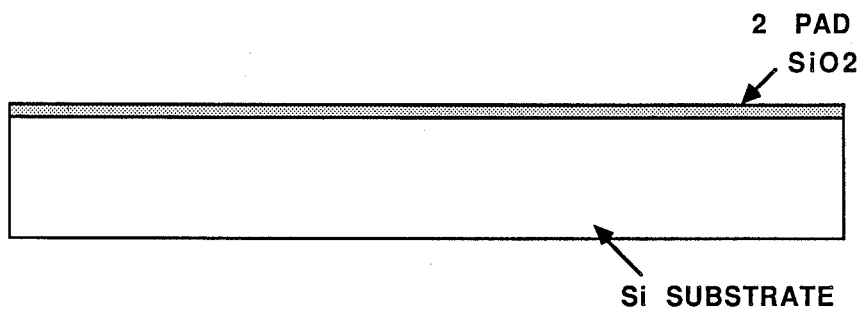
FIG. 1a is a cross-sectional diagram of a silicon substrate with a pad oxide.
Figure 1B:
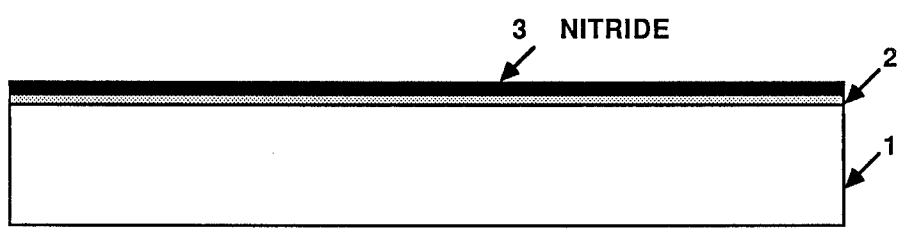
FIG. 1b is a cross-sectional diagram of the substrate of FIG. 1a after a film of silicon nitride has been formed.
Figure 1C:
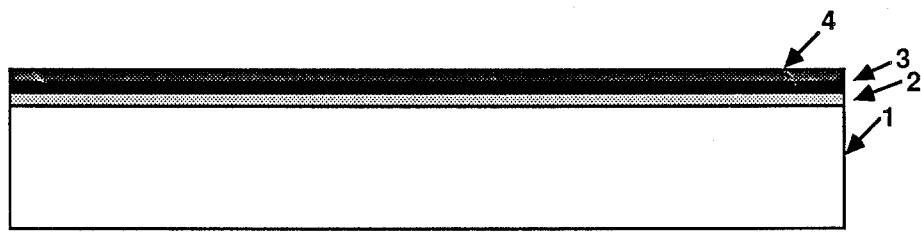
FIG. 1c is a cross-sectional diagram of the substrate of FIG. 1b after a film of silicon dioxide has been formed.
Figure 1D:
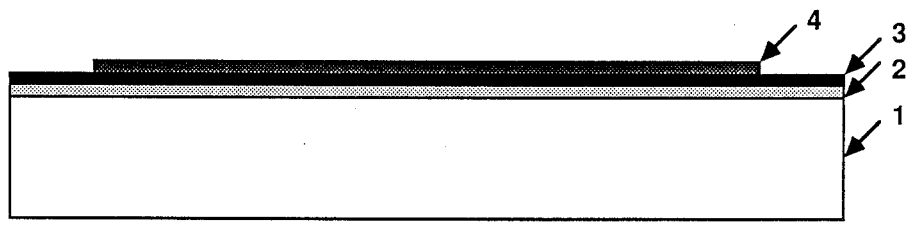
FIG. 1d is a cross-sectional diagram of the substrate of FIG. 1c after the silicon dioxide film has been etched by, for example, hydrofluoric acid.
Figure 1E:
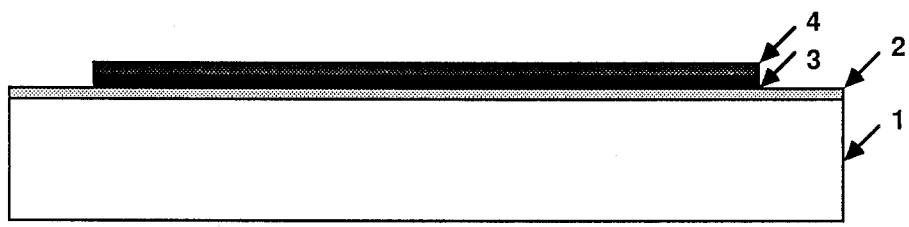
FIG. 1e is a cross-sectional diagram of the substrate of FIG. 1d after the silicon nitride film has been etched.
Figure 1G:
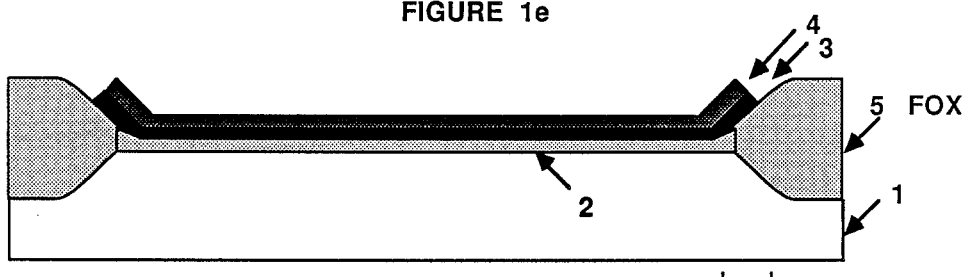
FIG. 1g is a cross-sectional diagram of the substrate of FIG. 1f after the remaining masking films have been removed.
Figure 1G:
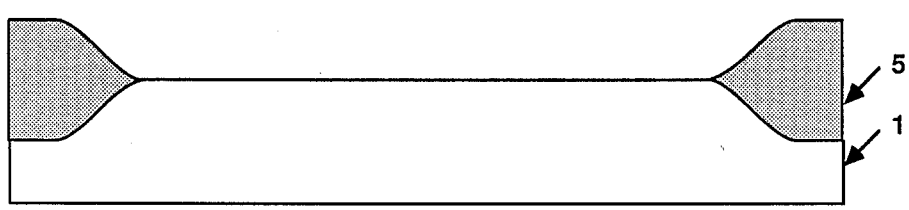
Figure 2A:
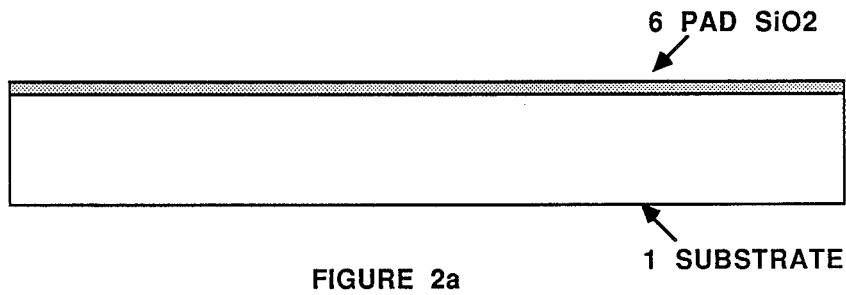
FIG. 2a is a cross-sectional diagram of a silicon substrate with a stress relief oxide.
Figure 2B:
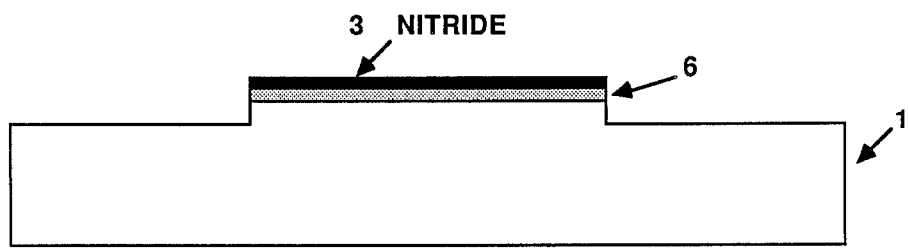
FIG. 2b is a cross-sectional diagram of the substrate of FIG. 2a after a silicon nitirde layer has been deposited and etched and the silicon substrate has itself been etched in a plasma.
Figure 2C:
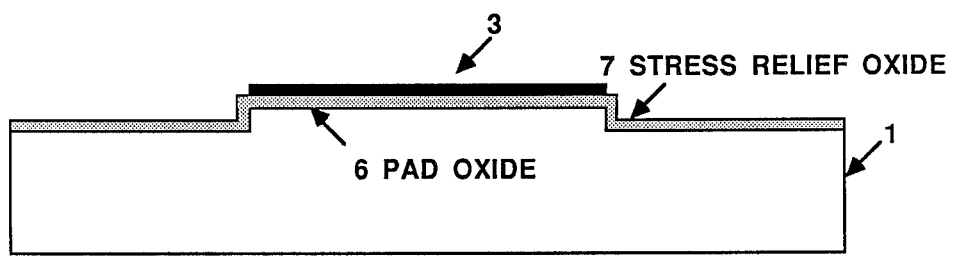
FIG. 2c is a cross-sectional diagram of the substrate of FIG. 2b after growth of a second stress relief oxide.
Figure 2D:
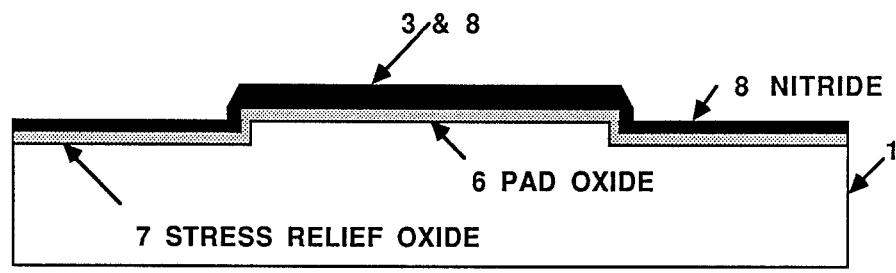
FIG. 2d is a cross-sectional diagram of the substrate of FIG. 2c after a second film of silicon nitride has been deposited.
Figure 2E:
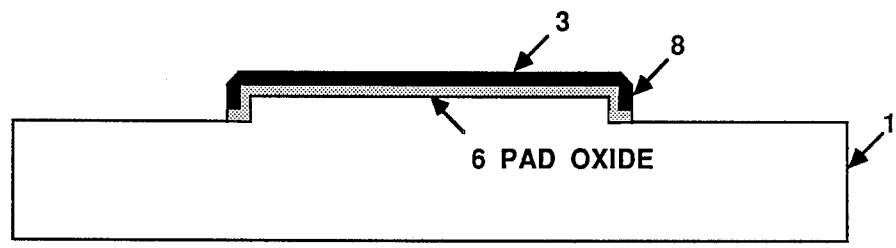
FIG. 2e is a cross-sectional diagram of the substrate of FIG. 2d after the second film of nitride has been etched.
Figure 2F:
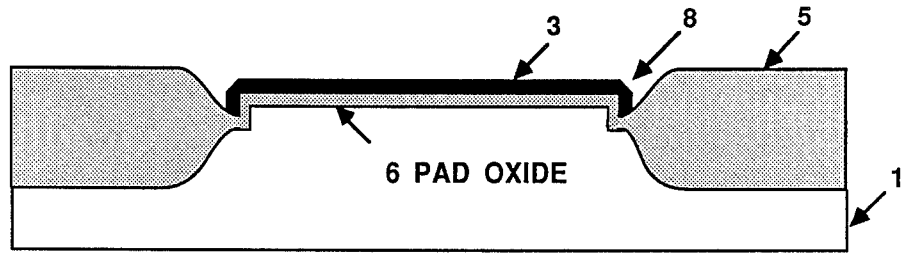
FIG. 2f is a cross-sectional diagram of the substrate of FIG. 2e after much of the field oxide has been grown showing the limited field oxide encroachments because of sidewall masking.
Figure 2G:
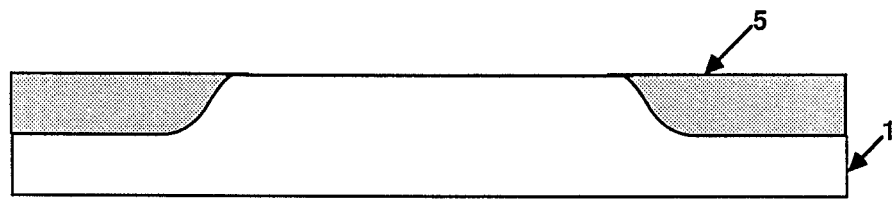
FIG. 2g is a cross-sectional diagram of the substrate of FIG. 2f after the remaining masking films and a portion of the field oxide have been removed.
Figure 3A:
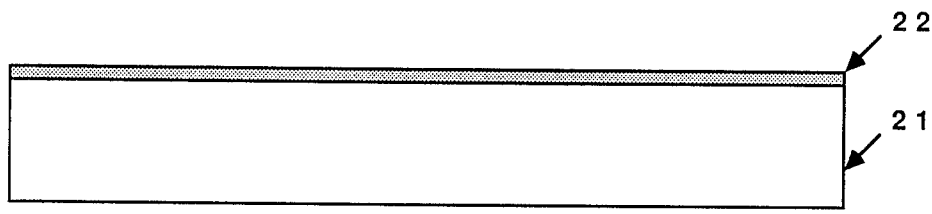
FIG. 3a is a cross-sectional diagram of a substrate of silicon with a thin pad oxide.

Following the front end cleaning steps and other steps (e.g. formation of the n-well for the P-MOS devices), a thin pad oxide 22 having a thickness of about 90 Angstroms is formed on the silicon substrate 21. It has been found that the thickness of the pad oxide 22 may be varied by +/−10 Angstroms; pad oxides which are thicker than about 100 Angstroms will result in longer bird's beaks while pad oxides which are thinner than about 80 Angstroms will cause stress problems between the silicon substrate and the silicon nitride layer. FIG. 3a illustrates the pad oxide 22 covering the silicon substrate 21, which may include the well known upper epitaxial semiconductor layer. The pad oxide 22 is usually formed by thermal growth of oxide in the conventional furnace. The pad oxide is nitridized through rapid thermal nitridization (RTN). RTN, by virtue of its speed and annealing cycle, leaves the wafer virtually undamaged from heat, reducing wafer warpage and reducing the amount of time the wafer (and its devices) is exposed to high temperatures which tend to drive the n type dopants in the well for the P-MOS devices.

In the preferred embodiment, RTN was accomplished with a rapid thermal annealing heat pulse system (a rapid thermal annealer) typically powered by an arc lamp, tungsten/halogen lamp or any other radiant energy source (e.g. laser). These systems are commercially available, such as the RTA (rapid thermal annealing) Heatpulse system of AG Associates Model 2101 (Tungsten/Halogen Lamp) (although certain systems require minor modification by adding an ammonia purge to accommodate ammonia gas at high temperature). The substrate 21, covered by the pad oxide 22, as shown in FIG. 3a, is placed in the system with ambient ammonia gas and exposed to a thermal annealing cycle such as that shown in FIG. 4.

Figure 3B:
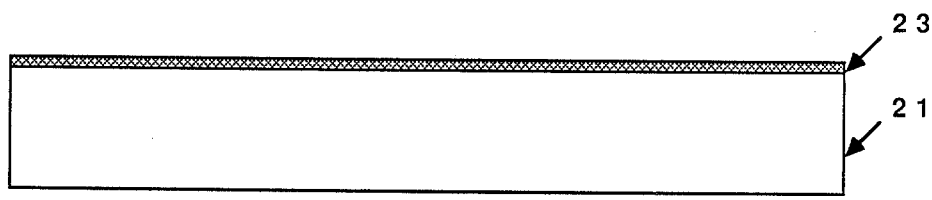
FIG. 3b is a cross-sectional diagram of the substrate of FIG. 3a after rapid thermal nitridization showing the nitridized pad oxide 23.
Figure 4:
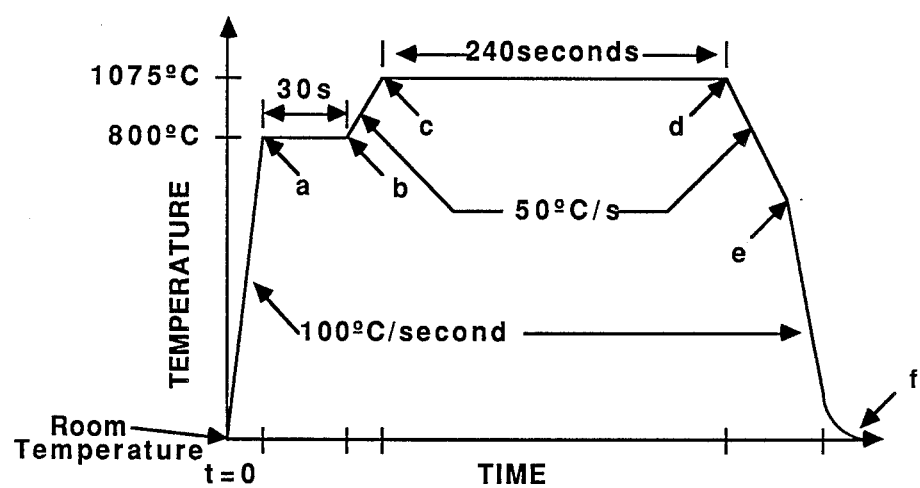
FIG. 4 is a graphical representation of the temperature annealing cycle (by time versus temperature °C.) used in rapid thermal nitridization in the preferred embodiment of the present invention.

Referring to FIG. 4, from room temperature, the substrate 21 and its pad oxide 22 is heated to 800° C. (to point "a") at a rate of 100° C. per second. This temperature is maintained for approximately 30 seconds (i.e. 30 seconds from point "a" to point "b", FIG. 4) after which the temperature is increased to 1075° C. (to point "c", shown in FIG. 4) at a rate of 50° C. per second. This temperature is maintained for approximately *240* seconds (i.e. *240* seconds from point "c" to point "d") after which the temperature is returned to room temperature in two phases. The temperature is brought down to 700° C. at a rate of 50° C. per second, and to room temperature at 100° C. per second. The structure resulting from this cycle is shown is FIG. 3b, wherein the pad oxide 22 has been converted to a nitridized oxide 23 which covers the silicon substrate 21.

Typically, the resultant nitridized oxide film has an average nitrogen content of approximately 25% (as determined by Auger analysis). The prior art would typically require a 3 hour cycle in a nitridization at 1000° C. to achieve the same results that this RTN cycle accomplished in several minutes. The RTN cycle does this with virtually no damage to the wafer to produce the structure shown in FIG. 3b.

Figure 3C:
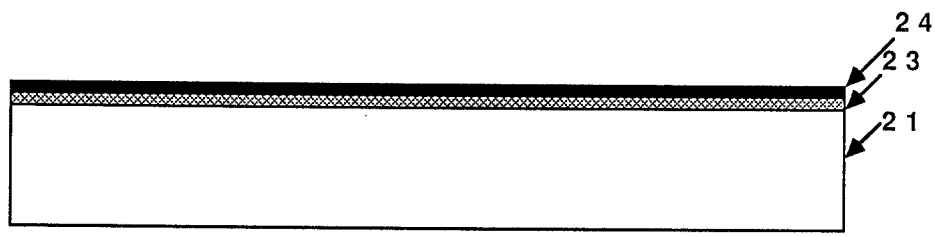
FIG. 3c is a cross-sectional diagram of the substrate of FIG. 3b after a silicon nitride film 24 has been deposited.
Figure 3C:
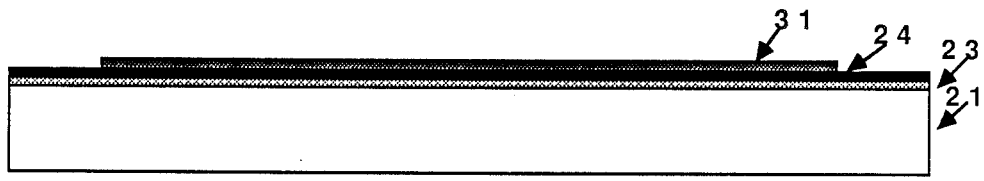

The substrate, covered with the nitridized oxide 23, is then exposed to low pressure chemical vapor deposition (CVD) to form a film of silicon nitride 24 over the nitridized oxide 23, resulting in the structure shown in FIG. 3c. Other techniques known in the art may be used to form the silicon nitride 24 layer. Low pressure CVD, a well known way to form silicon nitride (such as nitride 24), often involves a reaction of $SiH_4$ and $NH_3$ supplied in an inert carrier gas to a reaction chamber, at high temperature and low pressure.

At this point in the process (FIG. 3c), one may pattern the nitride 24 and nitridized oxide 23 shown in FIG. 3c in the conventional manner employing standard photolithography with positive photoresist followed by plasma etching in flourine chemistry, to remove the silicon nitride 24. The pad oxide 23 can be removed contentionally in HF. This exposes areas of the silicon where field oxide growth is desired (forming regions where open windows exist which expose the surface of the substrate), and those layers remain over device regions of the substrate (see structure shown in FIG. 3d) allowing the growth of field oxide in selected (non-device) regions. The use of conventional wet etching, particularly HF acid, to etch the nitridized pad oxide produces erratic results as the acid etch rate on the nitridized oxide 23 layer varies with the thickness and nitrogen content of that layer. Therefore, wet etching often produces uneven undercutting of the pad oxide; during field oxide growth, that undercutting causes large and erratic encroachment of the bird's beak.

Figure 3D:
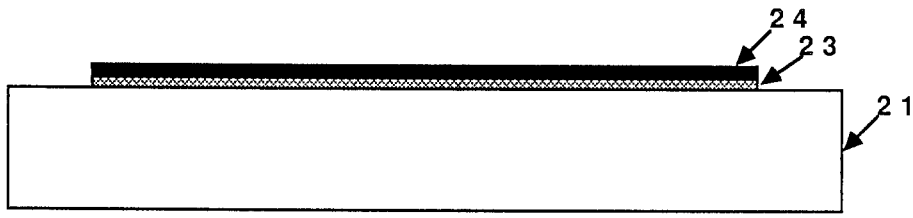
FIG. 3d is a cross-sectional diagram of the substrate and associated regions of FIG. 3c after dry plasma etching of the silicon nitride and nitridized pad oxide layers.

Accordingly, an alternative etching technique is preferred in this invention to produce the structure shown in FIG. 3d. In that technique, dry plasma etching is used to etch the films 24 and 23. In the preferred embodiment, this is a two-step process. However, it may also be accomplished in one. In the first step of the two step process, the silicon nitride 24 layer is coated with a dyed positive photoresist masking material 31 and is patterned (photographically as is well known in the art) to produce the structure shown in FIG. 3cc where the photoresist masking material 31 has been patterned such that it covers the region intended for devices and has been etched away in areas where the field oxide will be grown. The photoresist masking material 31 should not be etched away by the plasmas to which it will be exposed. Such photoresists, as is well known in the art, are commercially available (e.g. Hunt Chemical). The structure, as shown in FIG. 3cc, is then immersed in a plasma of 40% Argon and 60% $SF_6$ at 25° C. and 270 millitorr for 35–40 seconds in a commercially available parallel plate plasma etcher; the maximum wafer temperature (rather than the gases' temperature) is about 100° C., with the plasma power set at about 50 watts. This etches regions of the silicon nitride 24 layer and produces windows in the layer 24 which expose regions of the layer 23 below which field oxide will be formed. The nitridized oxide 23 is then etched in the second step by placing the structure in a plasma of 10% $CHF_3$, 20%

$C_2F_6$, and 70% He at 25° C. and 2 torr for about 15-20 seconds. While the gases' temperature is about 25° C., the maximum wafer temperature should be about 100° C., and the plasma power should be set at about 450 watts. This etches regions of the nitridized silicon dioxide layer 23 which were exposed from the previous step and thereby exposes the regions of the substrate where field oxide will be grown. The photoresist masking material 31 is then removed using conventional solvents for that material, which produces the structure shown in FIG. 3d where the layers 24 and 23 cover the areas intended for devices; these layers 24 and 23 prevent the growth of field oxide in the device regions. The dry etching techniques are well known, but have not been applied until this invention in this manner to etch the field oxidation masks used in the invention. See, in general, A. Weiss, "Plasma Etching of Oxides and Nitrides", Semiconductor International, Feb. 1983, p. 56. This dry plasma etching works anisotropically and results in a more consistent etching profile than acid baths. The etching opens up areas (i.e. removes portions of layers 23 and 24) on the substrate where field oxide will be grown. These areas which are opened are "windows" exposing the substrate for field oxide growth.

Rather than etch to open the windows for field oxide growth by using a two step process, the invention may be practiced with a one step process. The one step process also uses the wafer masked by the photoresist material 31 as shown in FIG. 3cc. That structure is placed in a plasma of 10% $CHF_3$, 20% $C_2F_6$, and 70% He at 25° C. and 2 torr in a parallel plate plasma etcher, with the plasma power at 450 watts, for about 75-80 seconds. It takes about 60 seconds in this plasma to etch the nitride layer 24 and about 15-20 seconds to etch the nitridized oxide. As with the two step etching process, the photoresist masking material 31 is removed conventionally in an oxygen plasma etcher which produces the structure shown in FIG. 3d. The end point of this one-step plasma etch tends to occur automatically as the selectivity of the etch for oxide ($SiO_2$) or nitride ($Si_3N_4$) versus for silicon is at least 5:1; thus, the etching is at least five times faster on oxide or nitride than on the silicon substrate. Moveover, SiF polymers tend to form on the silicon substrate when the nitridized oxide is removed, which polymers act to block further etching of the substrate. These polymers are easily removed in the subsequent removal of the photoresist mask material 31.

Rather than manually time the plasma etching, one may use automatic end point detection, as is well known in the art, by optical spectroscopy using the $O_2$ species which, when it disappears, indicates the end point because the $SiO_2$ layer (nitridized oxide 23) has been removed. The spectrophotometer monitors the $O_2$ species in the reaction chamber and automatically shuts down the plasma etcher at the end point.

Figure 3E:
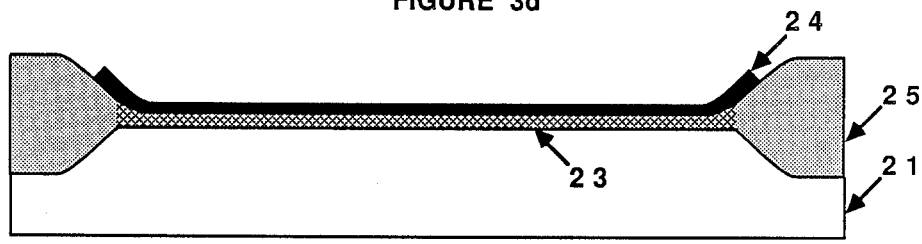
FIG. 3e is a cross-sectional diagram of the substrate of FIG. 3d after a field oxide has been grown.
Figure 3F:
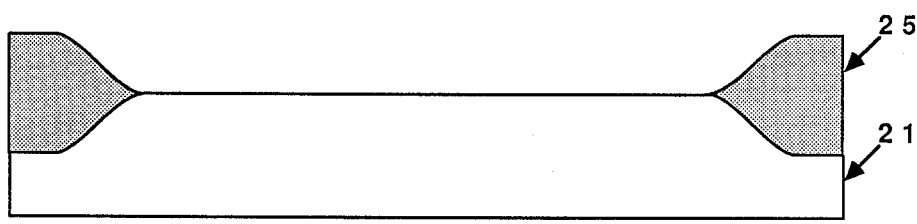
FIG. 3f is a cross-sectional diagram of the substrate of FIG. 3e after the silicon nitride and nitridized pad oxide films have been removed.

The field oxide 25 is then grown in the conventional manner on the substrate as shown in FIG. 3d in a high temperature wet environment. FIG. 3e illustrates the structure of a device region surrounded by the field oxide 25. Finally the wafer is prepared for the formation of the silicon devices by removing the remainder of the nitride 24 and nitridized oxide 23 layers using conventional masking and etching techniques resulting in the structure shown in FIG. 3f.

With a 6000 Angstrom field oxide layer, the resultant bird's beak is approximately 0.2 microns using the invention. This is a notable improvement in bird's beak reduction over standard LOCOS and it is accomplished with fewer steps. Additionally, warpage and other heat damage are eliminated with no loss of isolation.

One of the invention's features is the use of rapid thermal oxidation, to form the pad oxide 22, in the same rapid thermal annealer (RTA) in which that pad oxide is nitridized to form the nitridized pad oxide 23. That is, beginning with the cleaned substrate 21, one may grow the pad oxide 22 in the same RTA which is used to nitridize the oxide. The wafer which includes the substrate 21 is placed in the RTA unit and exposed to an oxygen source (e.g. 100% $O_2$) for about 2 to 3 minutes at 1075° C. This forms the pad oxide 22. The gas supply is changed from an oxygen source to a nitrogen source by purging the oxygen source from the RTA chamber which surrounds the substrate 21 and introducing the nitrogen source (e.g. $NH_3$). Following this conversion of the gases in the RTA, the nitridization of the pad oxide 22 may proceed as described above and as shown in FIG. 4. This method reduces the thermal cycling time during which the devices on the substrate are exposed to high temperatures and reduces the handling of the wafer. Another advantage of this method is that the thin pad oxide of 90 Angstroms can be grown in-situ (where it will be nitridized) in a very controlled manner in the RTA at a high temperature (e.g. 1050° C.) where the integrity of the oxide is relatively certain. The single wafer capacity of the commercially available RTA units assists in assuring the controllability of this processing. In contrast, such a thin oxide can be grown controllably in a furnace only at lower temperatures (e.g. 850° C.) where the integrity of the oxide is questionable due to the higher temperatures necessary to anneal out defects in the oxide (e.g. the oxide's relaxation temperature of about 950° C.).

The present invention therefore is a process for selectively growing localized field oxides which requires fewer steps than the prior art, yields greater consistency than the prior art and does not otherwise damage the wafer and reduces the amount of time the wafer is exposed to high temperatures. Costs are reduced and quality is enhanced.

This description is not intended to limit the scope of this invention, its flexibility, or its applications, but is intended merely to illustrate one possible execution. Many variations from the specifics disclosed are possible without departing from the spirit or scope of the invention as claimed.

We claim:

1. In the fabrication of MOS semiconductor devices in a silicon substrate, the process for forming a localized field oxide comprising:

forming a pad oxide on said silicon substrate, said pad oxide comprising silicon dioxide;

nitridizing said pad oxide in the presence of a nitrogen source for a short period of time, said period of time being less than 10 minutes, said nitridizing step producing a nitridized pad oxide;

forming a layer of silicon nitride over said nitridized pad oxide;

opening up windows in said silicon nitride layer in areas intended for field oxide growth thereby exposing regions of said nitridized pad oxide;

etching the exposed regions of said nitridized pad oxide to expose portions of said substrate;

forming field oxide regions on said exposed portions of said silicon substrate, whereby the growth of field oxide is localized with minimal lateral encroachment of the field oxide under said silicon nitride.

2. In the fabrication of MOS semiconductor devices on a silicon substrate, the process for forming localized field oxide regions in said substrate, said process comprising:

forming a layer of silicon dioxide on said silicon substrate, the bottom surface of said layer of silicon dioxide abutting the upper surface of said substrate;

nitridizing said layer of silicon dioxide by exposing said layer of silicon dioxide to a rapid annealing cycle in a gaseous nitrogen source, said rapid annealing cycle being less than 10 minutes and having a temperature of at least 800° C. for at least some time, said layer of silicon dioxide having a nitrogen content of at least 15% nitrogen after the nitridization of said layer of silicon dioxide to thereby form a nitridized silicon dioxide layer;

forming a layer of silicon nitride over said layer of silicon dioxide after said layer of said silicon dioxide has been nitridized;

removing regions of said layer of silicon nitride to expose regions of said nitridized silicon dioxide layer where field oxide will be formed;

removing the exposed regions of said nitridized silicon dioxide layer to expose regions of said substrate where field oxide will be formed;

forming field oxide regions in said substrate in said regions where silicon nitride and nitridized silicon dioxide have been removed, whereby field oxide regions are formed on said substrate with minimal lateral encroachment under said silicon nitride layer.

3. The process as defined in claim 2 wherein said regions of said layer of silicon nitride are removed by dry plasma etching in a plasma which comprises $SF_6$ and Ar.

4. The process as defined in claim 3 wherein said exposed regions of said nitridized silicon dioxide layer are removed by dry plasma etching in a plasma which comprises $CHF_3$, $C_2F_6$ and He.

5. In the fabrication of MOS semiconductor devices on a silicon substrate having an upper surface wherein said devices are disposed, the process for forming localized field oxide regions in said substrate, said process comprising:

forming a layer of silicon dioxide on the upper surface of said silicon substrate, said layer of silicon dioxide having a thickness of approximately 90 Angstroms and being formed in a rapid thermal annealer having an oxygen source;

nitridizing said layer of silicon dioxide to produce a nitridized layer of silicon dioxide by exposing said layer of silicon dioxide in said rapid thermal annealer to a nitrogen source during a rapid heating cycle being less than 10 minutes and having a temperature of at least 1000° C. for at least some time during said cycle, said nitridized layer of silicon dioxide having a nitrogen content of at least 15% nitrogen after the nitridization of said layer of silicon dioxide to thereby form a nitridized silicon dioxide layer;

forming a layer of silicon nitride over said nitridized silicon dioxide layer;

removing regions of said layer of silicon nitride where field oxide will be formed to expose regions of said nitridized silicon dioxide layer;

removing the exposed regions of said nitridized silicon dioxide layer to expose regions of said substrate where field oxide will be formed;

forming field oxide regions in the exposed regions of said substrate where silicon nitride and nitridized silicon dioxide have been removed, whereby field oxide regions are formed on said substrate with minimal lateral encroachment under said silicon nitride layer.

6. The process as defined in claim 5 wherein said regions of said layer of silicon nitride are removed by dry plasma etching in a plasma which comprises $C_2F_6$, $CHF_3$, and He in a unidirectional, parallel plate plasma etcher.

7. The process as defined in claim 6 wherein said exposed regions of said nitridized layer of silicon dioxide are removed by dry plasma etching in a plasma which comprises $C_2F_6$, $CHF_3$, and He.

8. The process as defined in claim 5 wherein said nitrogen source comprises ammonia.

* * * * *